United States Patent [19]

Weiss et al.

[11] Patent Number: 5,673,804
[45] Date of Patent: Oct. 7, 1997

[54] HOIST SYSTEM HAVING TRIANGULAR TENSION MEMBERS

[75] Inventors: Mitchell Weiss, Acton, Mass.; Gerald M. Friedman, New Ipswich, N.H.

[73] Assignee: PRI Automation, Inc., Billerica, Mass.

[21] Appl. No.: 770,516

[22] Filed: Dec. 20, 1996

[51] Int. Cl.$^6$ .................................................. B66C 13/06
[52] U.S. Cl. .............................. 212/274; 212/71; 254/264; 254/278
[58] Field of Search ................................. 254/264, 278; 212/274, 71, 330, 331

[56] References Cited

U.S. PATENT DOCUMENTS

| | | | |
|---|---|---|---|
| 3,602,544 | 8/1971 | Marsh | 294/74 |
| 3,794,125 | 2/1974 | Nelson | 175/6 |
| 3,815,509 | 6/1974 | Voronin et al. | 104/88 |
| 3,887,090 | 6/1975 | Reckseit et al. | 214/17 C |
| 3,967,387 | 7/1976 | Marchegiani | 35/12 P |
| 4,164,080 | 8/1979 | Kosydar et al. | 35/12 P |
| 4,203,368 | 5/1980 | Haskins | 104/92 |
| 4,246,987 | 1/1981 | McMordie et al. | 191/32 |
| 4,426,987 | 1/1984 | Latsch et al. | 123/571 |
| 4,456,890 | 6/1984 | Carickhoff | 331/1 A |
| 4,491,227 | 1/1985 | Buzzichelli et al. | 212/196 |
| 4,536,690 | 8/1985 | Belsterling et al. | 318/687 |
| 4,568,233 | 2/1986 | Baker et al. | 414/267 |
| 4,881,548 | 11/1989 | Kramer | 254/278 |
| 4,883,184 | 11/1989 | Albus | 212/146 |
| 4,905,848 | 3/1990 | Skjonberg | 212/274 |
| 4,932,541 | 6/1990 | Belsterling | 212/274 |
| 4,949,855 | 8/1990 | Foit | 212/274 |
| 4,973,219 | 11/1990 | Brickner et al. | 414/792.9 |
| 4,986,915 | 1/1991 | Meurer | 254/278 |
| 5,179,525 | 1/1993 | Griffis et al. | 364/512 |
| 5,213,045 | 5/1993 | Gersemsky | 104/93 |
| 5,263,382 | 11/1993 | Brooks et al. | 74/471 |
| 5,265,742 | 11/1993 | Stenger et al. | 212/179 |
| 5,271,290 | 12/1993 | Fischer | 74/471 |
| 5,373,926 | 12/1994 | Clarke et al. | 191/23 R |
| 5,522,581 | 6/1996 | Kulhavy | 254/267 |
| 5,552,581 | 9/1996 | Jasper, II et al. | 219/523 |
| 5,568,189 | 10/1996 | Kneller | 254/264 |

*Primary Examiner*—Thomas J. Brahan
*Attorney, Agent, or Firm*—Weingarten, Schurgin, Gagnebin & Hayes LLP

[57] ABSTRACT

A hoist system having triangular suspension bands minimizes sway and twisting during the lifting of a payload. The system includes three depending retractable and extensible triangular tension members which provide three sets of opposed horizontal tensile forces aligned along three non-parallel lines. Each tension member comprises a flexible triangular band attached along one side to one of three rotatable spools arranged at 60° to each other. The bands are attached near their vertices to a payload gripper assembly which is raised or lowered as the bands are wound or unwound from the spools. The three triangular bands provide six horizontal force components which provide good lateral stability and torsional rigidity, thereby minimizing sway and twisting of the payload. The bands also provide good payload lifting strength.

24 Claims, 5 Drawing Sheets

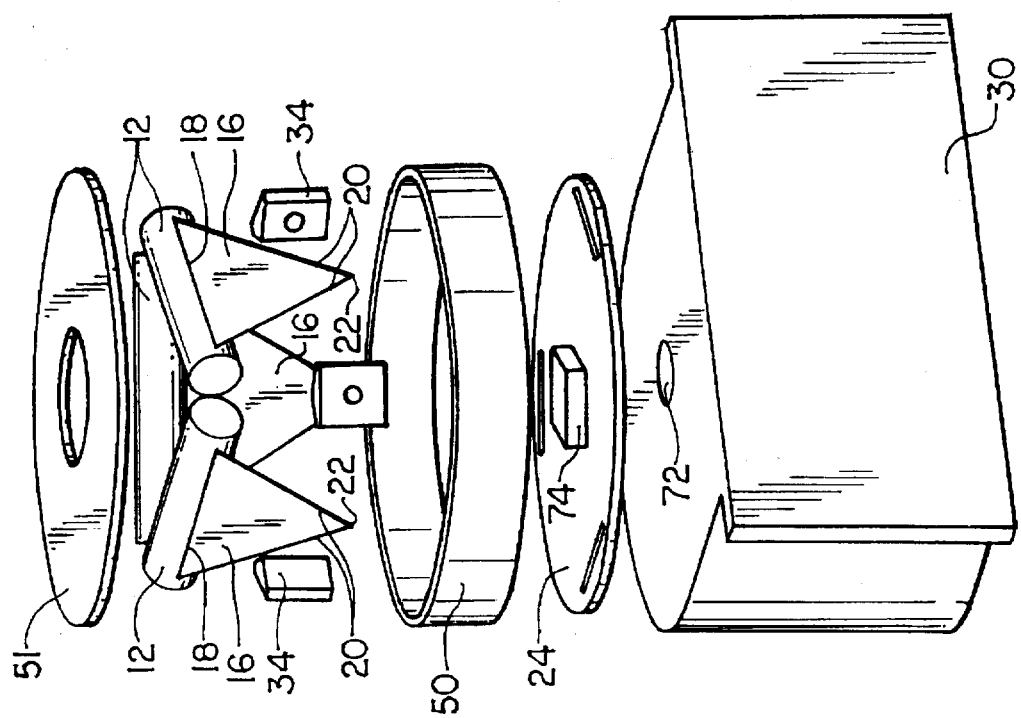
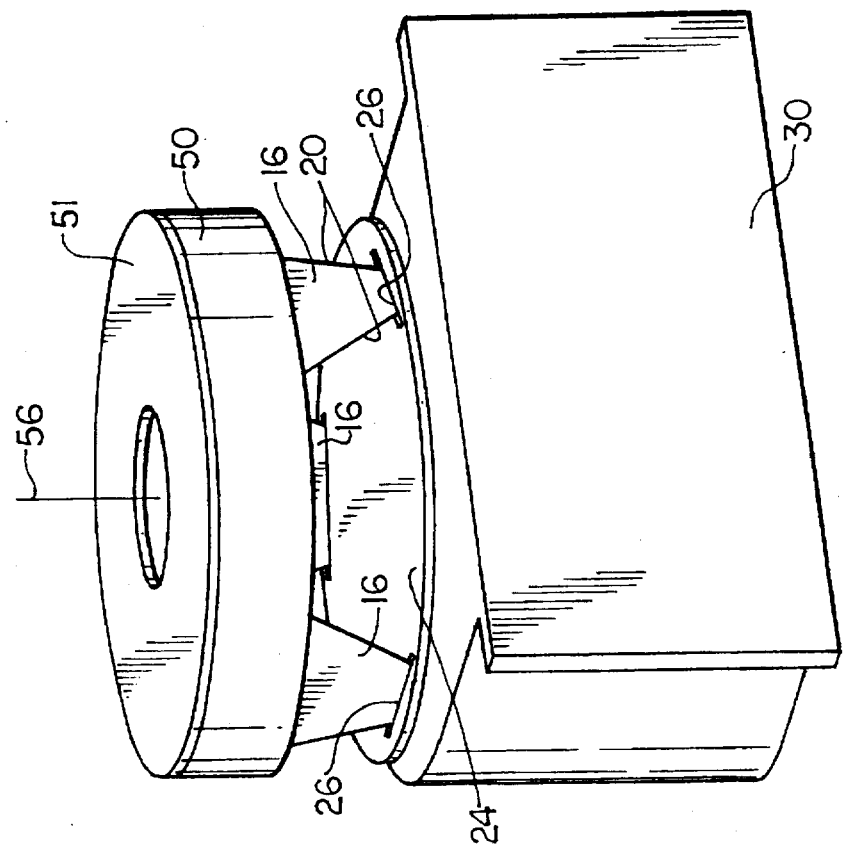
FIG. 2
FIG. 1

5,673,804

HOIST SYSTEM HAVING TRIANGULAR TENSION MEMBERS

BACKGROUND OF THE INVENTION

In manufacturing, particularly of semiconductor wafers, items must be transported around the factory from station to station. In some applications, the items are transported on an overhead lift system. Hoists are used to raise and lower the items from a station to an overhead rail system for movement to the next station. Typically, a hoist comprises a support platform suspended by four ropes which are reeled up or down to raise or lower the platform. Such suspension systems are subject to side-to-side sway and twisting. Also, the ropes must be reeled in unison at the same rate to prevent tilting of the platform, which requires a carefully designed spooling mechanism.

SUMMARY OF THE INVENTION

The present invention provides a hoist system which minimizes sway and twisting during the lifting of a payload while providing good lifting strength. In the preferred embodiment, the system includes three rotatable spools arranged at 60° to each other. Three flexible suspension bands are provided, each band having two sides of equal length joined at a vertex. Each band also includes a third side opposite the vertex which is attached to an associated one of the spools. Rotation of the spools causes the bands to wind up onto or unwind from the spools. The bands are attached near their vertices to a payload gripper assembly. The three triangular bands provide six horizontal force components which provide good lateral stability and torsional rigidity, thereby minimizing sway and twisting of the payload. The bands also provide good payload lifting strength.

DESCRIPTION OF THE DRAWINGS

The invention will be more fully understood from the following detailed description taken in conjunction with the accompanying drawings in which:

FIG. 1 is a perspective view of a hoist system of the present invention;

FIG. 2 is an exploded perspective view of the hoist system of FIG. 1;

DETAILED DESCRIPTION OF THE INVENTION

Figure 3:
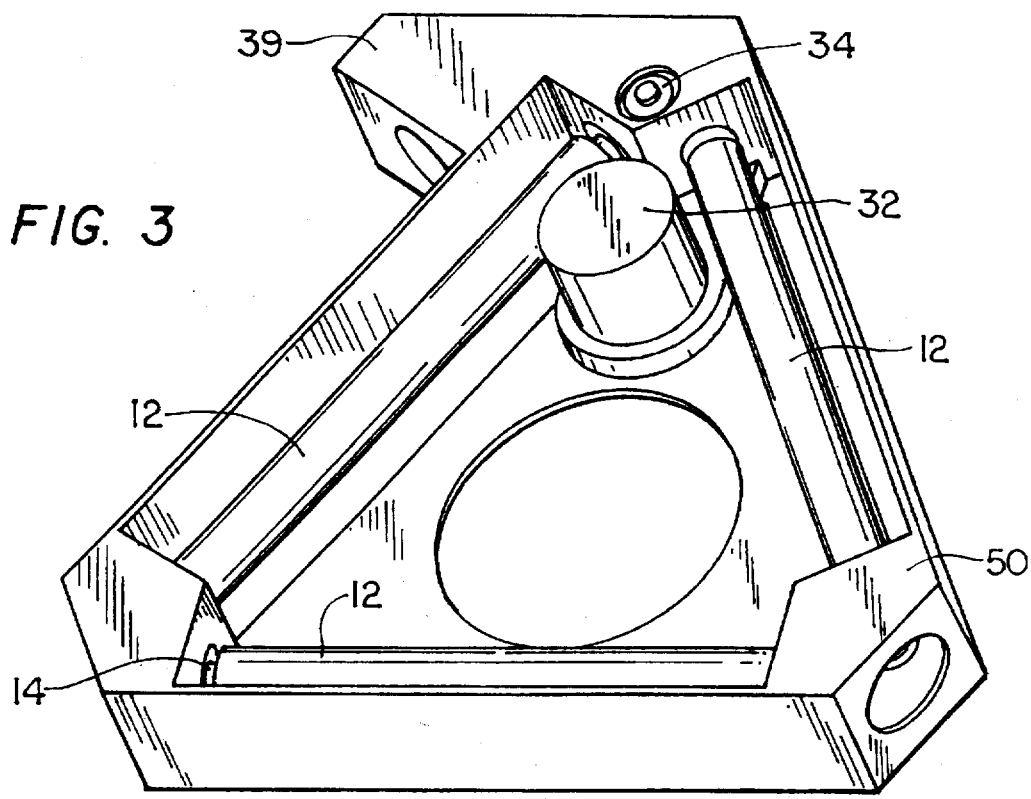
FIG. 3 is a top perspective view of the hoist system of the present invention.

Referring to FIGS. 1 through 5, the hoist system of the invention includes three spools 12 supported by a frame 14 and arranged at 60° to each other in a horizontal plane. Each spool is rotatable about its longitudinal axis. Three tension members comprising three triangular bands 16 made of a flexible material are attached along one side 18 to an associated spool 12 and can be wound up onto or unwound from the spool as the spool rotates. Typically, the triangular bands 16 are in the form of an isosceles triangle, in which the two sides 20 extending downwardly from each spool when the band is unwound are of equal length. The two sides 20 join at a vertex 22. Generally, the side 18 attached to the spool 12 is shorter than the two extending sides 20. The bands can be attached to the spools in any suitable manner, as, for example, by slipping the band into a slot in the spool and clamping it with a wedge piece. The length of the extending sides is chosen for the particular application. The bands are illustrated only schematically in the figures; it will be appreciated that the bands can be much longer than shown, particularly in FIGS. 1 and 2.

Each triangular band 16 is attached at a location 26 near its vertex 22 to a payload gripper assembly 24 (see FIG. 1). The band 16 cannot be attached exactly at the vertex of the triangle, since this attachment point would have too small a cross-section to provide sufficient payload lifting strength. Thus, the attachment location 26 is some distance above the vertex. The farther the attachment location is from the vertex, the greater the load carrying capacity of the band. The bands can be attached to the payload gripper 24 by any suitable attachment mechanism, such as by slipping the vertex through a slot in the gripper and fastening the vertex to an interior face or underside of the gripper.

Figure 8:
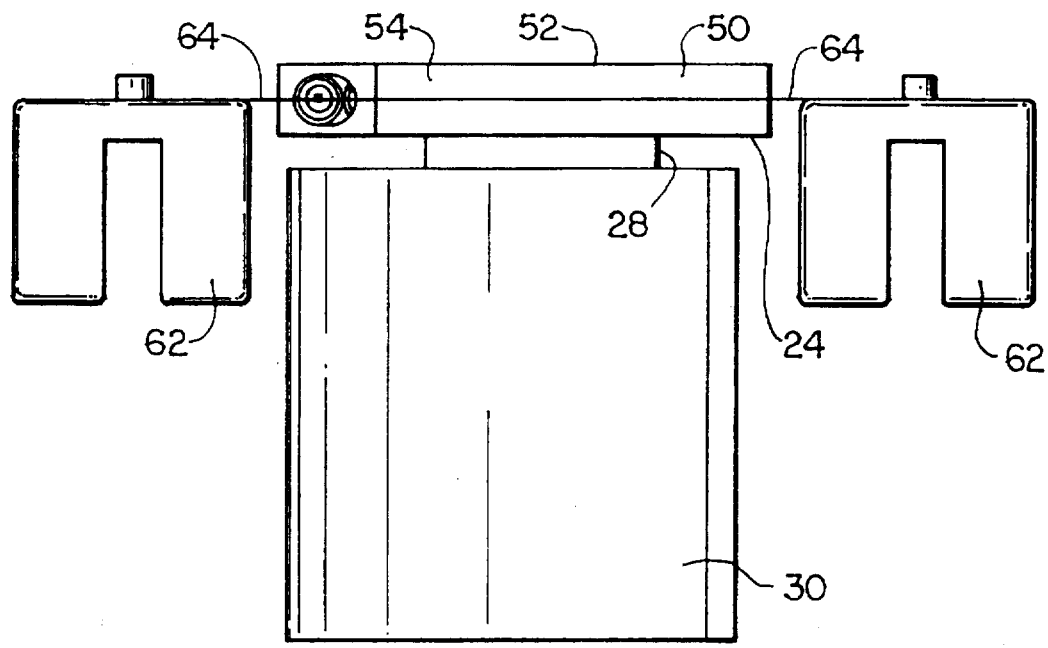
FIG. 8 is a side view of a hoist system of the present invention in conjunction with a rail transportation system.

The payload gripper assembly 24 includes any suitable mechanism 28 on its lower face for gripping a payload 30, indicated schematically in FIG. 8. In the embodiment illustrated, the payload 30 comprises a semiconductor wafer carrier, although the hoist system of the present invention is operable with any form of payload. Wafer carriers typically have a handle on the upper surface which can be grasped by a gripper assembly, as is known in the semiconductor industry.

Figure 4:
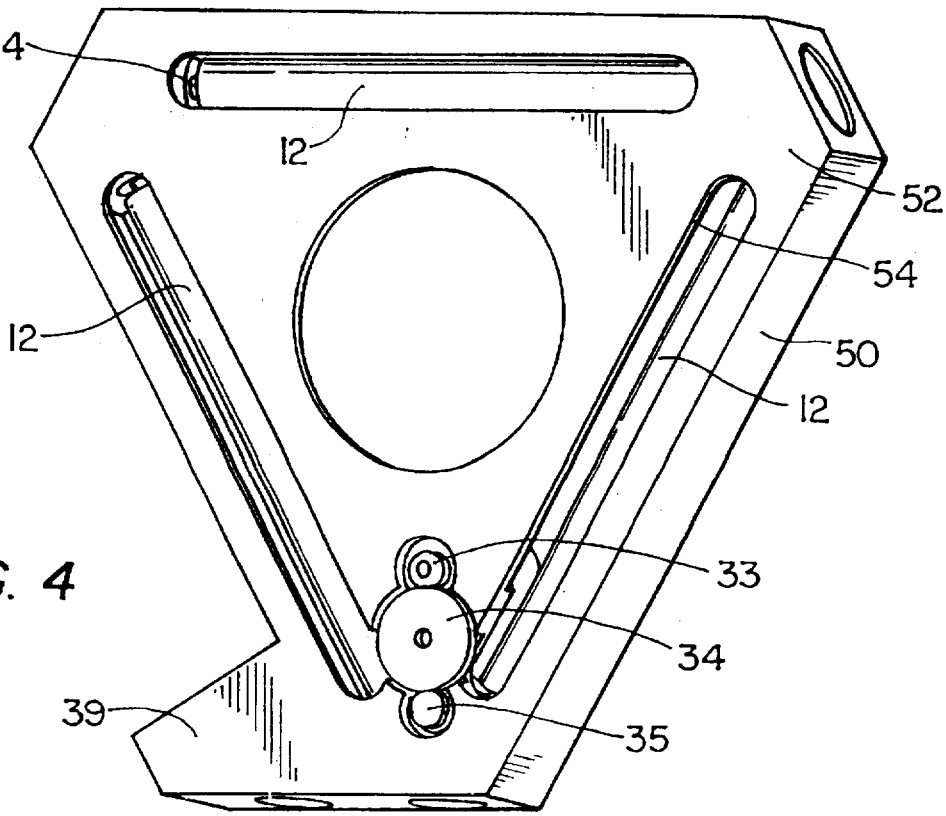
FIG. 4 is a bottom perspective view of the hoist system of FIG. 3.
Figure 5:
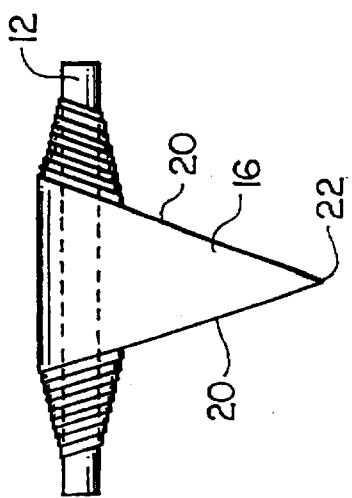
FIG. 5 is a side view of a triangular suspension band partially wound on a spool.

To raise or lower the payload once it has been gripped by the gripper assembly 24, the spools 12 are rotated simultaneously, thereby causing the triangular bands 16 to wind up onto or unwind from the spools, as indicated in FIG. 5. The bands wind up over themselves onto the spools. No complex winding mechanism is required. The spools 12 may be driven by a single motor 32 attached to one spool, the other spools being connected to the driven spool by an appropriate gearing mechanism, such as 60° miter gears. In FIGS. 3 and 4, the motor is located inside the triangular area defined by the three spools. The motor operatively communicates with the spools through, for example, a motor pinion 33, idler 34, and worm gear drive pinion 35 (see FIG. 4). A motor and gear train could also be located outside the spool's triangular area in an extension 39 of a housing 50. Alternatively, each spool may be driven by an associated motor, although the rotations must be appropriately synchronized to ensure the bands are wound and unwound at the same rate.

Figure 7:
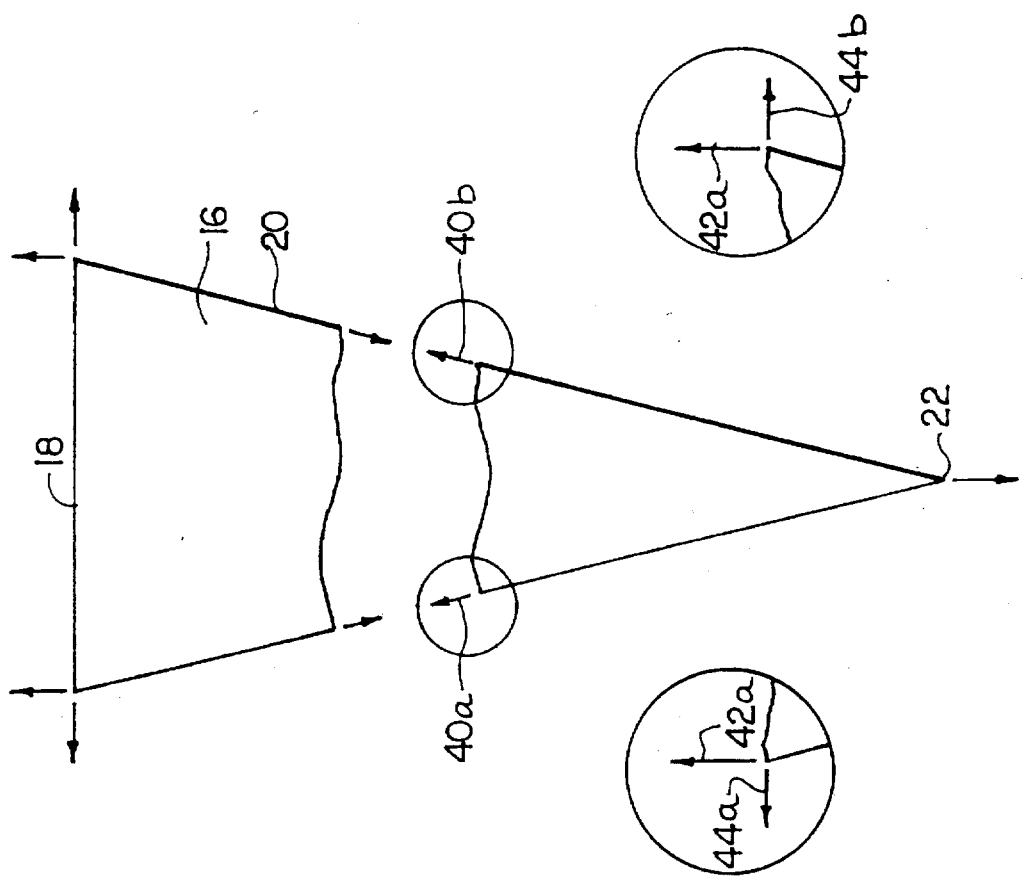
FIG. 7 is free body diagram of the triangular suspension band.
Figure 6:
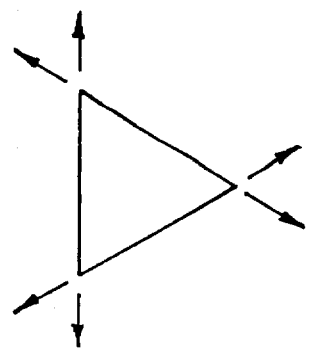
FIG. 6 is a schematic horizontal plan view of the horizontal force components of the triangular suspension bands.
Figure 12A:
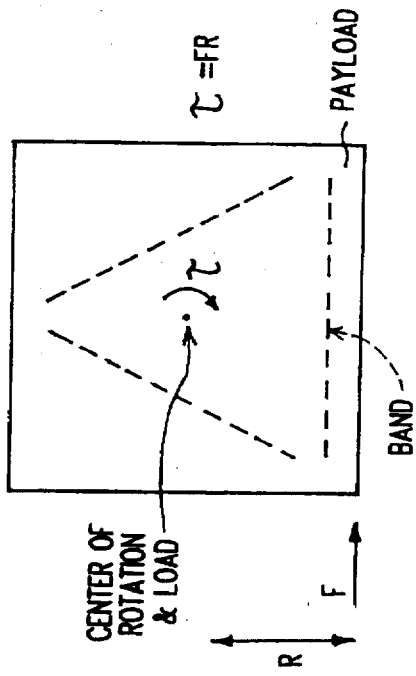
FIGS. 12A, 12B, and 12C are diagrams of the hoist system illustrating torsional resistance.
Figure 12B:
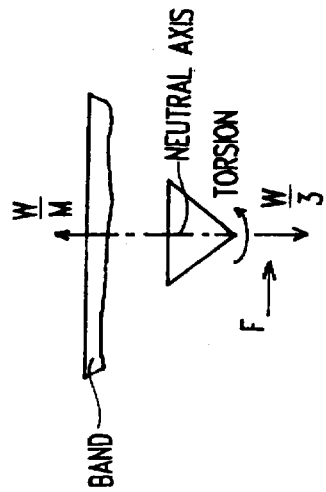
Figure 12C:
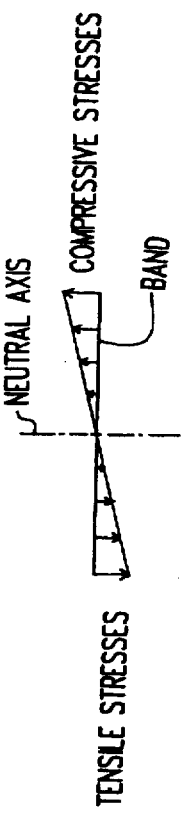

Referring to FIG. 7, each triangular band 16 is in tension and can be visualized as having a tensile force T directed along each angled side, indicated by vectors 40a, 40b. Each tensile force can be resolved into a vertical component 42a, 42b and a horizontal component 44a, 44b. As is apparent from the enlarged views in FIG. 7, the two sides of a band provide horizontal components 44a, 44b having opposite directions. By providing three bands angled at 60° to each other in a horizontal plane, six horizontal force components are provided in three pairs having opposite directions, as shown schematically in the horizontal plan view of FIG. 6. This system of force components results in good lateral stability. The torsional resistance of the system is increased by the addition of 45° diagonal bracing, since the use of a thin sheet as a tension member, as in the present invention, can be viewed as a system with an infinite number of diagonal braces, whereas wire ropes have none. Referring to FIGS. 12A, 12B, and 12C, a load F tending to twist the payload causes tensile and compressive stresses in the bands, again unlike wire ropes. Thus, shear stresses cancel out and there is reduced tendency for the bands to twist. Accordingly, the payload does not tend to sway from side to side or twist as it is raised or lowered, a problem with most prior art hoist systems.

The triangular bands 16 can be made from a thin sheet of material of, for example, stainless steel or high strength plastics. Because they can be made thin relative to the spool diameter or an equivalent strength rope, the bands have greater flexibility and a longer life. These properties also allow the spools 12 on which the bands are wound to be of a smaller diameter. For semiconductor wafer transport applications, a band thickness of approximately 0.002 inch is suitable. Also, bands are cleaner than rope or wire hoist systems. Additionally, if the bands are made of plastics, conductors can be added to the bands to deliver electrical signals to the gripper. If the bands are made of steel or another conductive metal, each band can be an independent conductor.

The spooling mechanism is typically disposed in the housing 50 to support the drive mechanism and keep the mechanism relatively free of contaminants. The housing may include an upper plate 51 (see FIG. 1) and a lower plate 52, which includes slots 54 through which the bands pass (see FIG. 4). In the embodiment shown in FIGS. 1 and 2, the housing is cylindrical, and in FIGS. 3 and 4, it is generally triangular. The extension 39, discussed above, may be provided for the motor and gear train if desired. Any other configuration could be used. The housing can also be mounted for rotation about a vertical axis 56 if desired (see FIG. 1).

Figure 9:
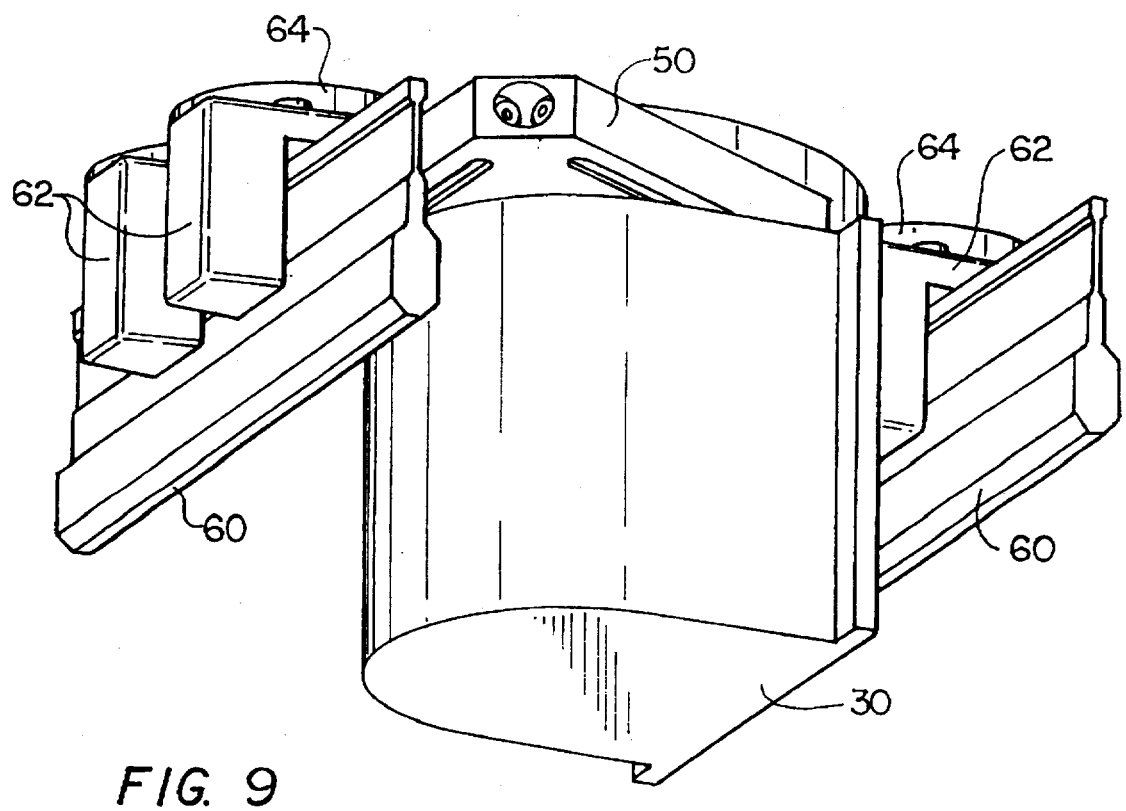
FIG. 9 is a perspective view of the hoist system of FIG. 8.

The hoist system is illustrated in conjunction with a rail transport system in FIGS. 8 and 9. For example, in the transport system shown, a pair of rails 60 are provided which are arranged to run to various desired locations in, for example, a factory. Monorail systems are also known. Suitable vehicles 62 are driven along the rails. The hoist system is mounted by laterally extending arms 64 to the vehicles 62. In this manner, the hoist system can be transported to any desired location. Such transport systems are well known, particularly in the semiconductor manufacturing industry.

The hoist system can be properly positioned over the payload by a targeting system, illustrated schematically in FIG. 2. The targeting system includes a target 72 such as an optically detectable mark or a transponder which is located on an upper surface of the payload. A camera or laser system 74 on the hoist locates the target and signals a control system to properly position the gripper over the payload.

Figure 10:
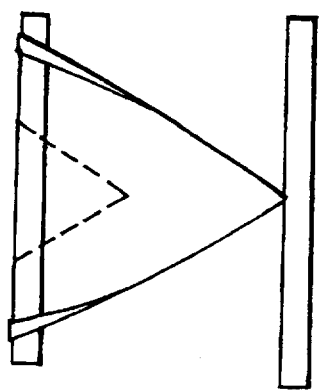
FIG. 10 is a schematic view of a further embodiment of the present invention.
Figure 11:
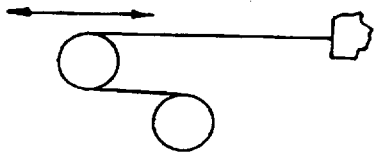
FIG. 11 is a schematic view of a further embodiment of the hoist system.

Although the preferred embodiment utilizes the above described spooling mechanism, it will be appreciated that other mechanisms for lifting and lowering the suspension bands could be provided. For example, the bands could wrap about two or more drums or pulleys which are schematically movable toward and away from each other, as indicated schematically in FIG. 11. Similarly, the suspension bands have been illustrated as solid sheets; however, the interior areas thereof could be removed if desired, since these areas do not provide a load bearing role, although the spooling of such bands would require careful handling to ensure the bands do not become entangled. In an alternative embodiment, each tension member may be a thin, flexible tape or strap which is windable on a spool or other suitable winding mechanism and is attached to a payload gripper assembly to form a triangular configuration. The tape winds up on the winding mechanism in a manner which retains the triangular configuration of the tape as indicated by the dotted lines in FIG. 10.

The invention is not to be limited by what has been particularly shown and described, except as indicated by the appended claims.

I claim:

1. A hoist system for lifting and lowering a payload comprising:

a frame;

a lifting mechanism supported by the frame operative for lifting and lowering;

a payload gripper assembly; and a suspension mechanism coupled to the lifting mechanism comprising depending tension members configured to provide three sets of opposed horizontal tensile forces aligned along three non-parallel horizontal lines, the tension members comprising depending bands each having a triangular configuration with two sides of equal length joined at a vertex and a third side opposite the vertex, the third side attached to the lifting mechanism, each tension member attached to the payload gripper assembly near the vertex.

2. The hoist system of claim 1, wherein the lifting mechanism comprises three longitudinally extending spools supported by the frame and arranged at 60° to each other in a plane, each spool supported for rotation about its associated longitudinal axis.

3. The hoist system of claim 2, wherein the lifting mechanism further comprises a rotational drive mechanism operatively connected to the spools for rotating the spools.

4. The hoist system of claim 2, wherein the tension members of the suspension mechanism comprise three flexible bands, each band having a triangular configuration with two sides of equal length joined at a vertex and a third side opposite the vertex, the third side attached to an associated one of the three spools, whereby rotation of the associated spool causes the band to wind up onto or unwind from the spool, each band attached to the payload gripper assembly near the vertex.

5. The hoist system of claim 2, further comprising a housing enclosing the spools.

6. The hoist system of claim 2, wherein the rotational drive mechanism comprises a motor connected to one of the spools and gearing rotationally coupling the three spools.

7. The hoist system of claim 1, wherein the three horizontal lines are at 60° to each other.

8. The hoist system of claim 1, wherein the frame is rotatable about a vertical axis.

9. The hoist system of claim 1, wherein the frame is coupled to a rail transportation system.

10. The hoist system of claim 1, wherein the payload gripper assembly is configured to grip a semiconductor wafer carrier.

11. A transportation system comprising:

an overhead rail transportation system; and a hoist system coupled to the overhead rail transportation system for transport therealong, the hoist system comprising:

a frame;

a lifting mechanism supported by the frame operative for lifting and lowering;

a payload gripper assembly; and a suspension mechanism coupled to the lifting mechanism comprising depending tension members configured to provide three sets of opposed horizontal tensile forces aligned along three non-parallel horizontal lines, the tension members comprising depending bands each having a triangular configuration with two sides of equal length joined at a vertex and a third side opposite the vertex, the third side attached to the lifting mechanism, each tension member attached to the payload gripper assembly near the vertex.

12. The transportation system of claim 11, wherein the overhead rail transportation system is disposed in a factory.

13. The transportation system of claim 11, wherein the lifting mechanism comprises three longitudinally extending spools supported by the frame and arranged at 60° to each other in a plane, each spool Supported for rotation about its associated longitudinal axis.

14. The transportation system of claim 13, wherein the lifting mechanism further comprises a rotational drive mechanism operatively connected to the spools for rotating the spools.

15. The transportation system of claim 13, wherein the tension members of the suspension mechanism comprise three flexible bands, each band having a triangular configuration with two sides of equal length joined at a vertex and a third side opposite the vertex, the third side attached to an associated one of the three spools, whereby rotation of the associated spool causes the band to wind up onto or unwind from the spool, each band attached to the payload gripper assembly near the vertex.

16. The transportation system of claim 13, further comprising a housing enclosing the spools.

17. The transportation system of claim 13, wherein the rotational drive mechanism comprises a motor connected to one of the spools and gearing rotationally coupling the three spools.

18. The transportation system of claim 11, wherein the three horizontal lines are at 60° to each other.

19. The transportation system of claim 11, wherein the frame is rotatable about a vertical axis.

20. The transportation system of claim 11, wherein the payload gripper assembly is configured to grip a semiconductor wafer carrier.

21. The transportation system of claim 11, further comprising a target locating system disposed on the hoist system to locate and position the hoist system over a payload.

22. The transportation system of claim 21, wherein the target locating system comprises an optical camera or laser sensor disposed to detect a target located on the payload.

23. The transportation system of claim 22, wherein the target comprises an optically detectable mark or a transponder.

24. The transportation system of claim 21, wherein the target locating system is in communication with a controller for controlling positioning of the hoist system.

\* \* \* \* \*